US009172161B2

(12) United States Patent
Walden et al.

(10) Patent No.: US 9,172,161 B2
(45) Date of Patent: Oct. 27, 2015

(54) IMPEDANCE CONTROLLED LGA INTERPOSER ASSEMBLY

(71) Applicant: Amphenol InterCon Systems, Inc., Harrisburg, PA (US)

(72) Inventors: John D. Walden, Mechanicsburg, PA (US); James S. Hileman, Carlisle, PA (US)

(73) Assignee: Amphenol InterCon Systems, Inc., Harrisburg, PA (US)

( * ) Notice: Subject to any disclaimer, the term of this patent is extended or adjusted under 35 U.S.C. 154(b) by 262 days.

(21) Appl. No.: 13/899,095

(22) Filed: May 21, 2013

(65) Prior Publication Data
US 2014/0162472 A1    Jun. 12, 2014

Related U.S. Application Data

(60) Provisional application No. 61/736,232, filed on Dec. 12, 2012.

(51) Int. Cl.
*H01R 12/00* (2006.01)
*H01R 12/71* (2011.01)
*H01R 13/6473* (2011.01)

(52) U.S. Cl.
CPC .......... *H01R 12/714* (2013.01); *H01R 13/6473* (2013.01)

(58) Field of Classification Search
CPC .................................................. H01R 13/2442
USPC ......................................... 439/66, 862, 607.1
See application file for complete search history.

(56) References Cited

U.S. PATENT DOCUMENTS

| 3,090,027 | A | | 5/1963 | Phillips et al. | |
|---|---|---|---|---|---|
| 4,375,084 | A | | 2/1983 | Urushibata | |
| 4,836,791 | A | | 6/1989 | Grabbe et al. | |
| 5,237,743 | A | * | 8/1993 | Busacco | H01R 4/26 29/874 |
| 5,380,210 | A | * | 1/1995 | Grabbe et al. | 439/66 |
| 5,484,295 | A | * | 1/1996 | Mowry et al. | 439/66 |
| 5,599,194 | A | * | 2/1997 | Ozawa et al. | 439/72 |
| 6,164,978 | A | | 12/2000 | McHugh et al. | |
| 6,290,507 | B1 | | 9/2001 | Neidich et al. | |
| 6,375,474 | B1 | | 4/2002 | Harper, Jr. et al. | |
| 6,409,521 | B1 | * | 6/2002 | Rathburn | 439/66 |
| 6,733,303 | B2 | | 5/2004 | Maldonado et al. | |
| 6,945,788 | B2 | | 9/2005 | Trout et al. | |
| 7,044,746 | B2 | | 5/2006 | Copper et al. | |
| 7,059,869 | B2 | | 6/2006 | Wertz et al. | |
| 7,247,062 | B1 | * | 7/2007 | Polnyi | 439/862 |
| 7,275,936 | B1 | * | 10/2007 | Ju | 439/66 |

(Continued)

OTHER PUBLICATIONS

International Bureau of WIPO, International Preliminary Report on Patentability, Date of Mailing Jun. 25, 2015.

*Primary Examiner* — Neil Abrams
(74) *Attorney, Agent, or Firm* — Hooker & Habib, P.C.

(57) ABSTRACT

An interposer plate assembly having an insulating plate and metal contacts in the plate with contact points above and below the plate and a central portion in the plate. Two cantilever arms extend from the central portion to each contact point. The central portion may be formed to have a large area to form an impedance shield for reducing impedance between adjacent signal contacts. Plastic bodies may be overmolded on separate contacts or on contact pairs and may have sliding fits in passages of the interposer plate. Contacts may be arranged as differential pairs with ground contacts located between the differential pairs.

30 Claims, 15 Drawing Sheets

(56) References Cited

U.S. PATENT DOCUMENTS

| | | | |
|---|---|---|---|
| 7,284,993 B1 * | 10/2007 | Ju | 439/66 |
| 7,338,294 B2 * | 3/2008 | Polnyi | 439/66 |
| 7,364,434 B2 * | 4/2008 | Hu et al. | 439/66 |
| 7,390,200 B2 * | 6/2008 | Shuey | H01R 23/6873 439/79 |
| 7,658,616 B2 | 2/2010 | Hougham et al. | |
| 7,778,041 B2 | 8/2010 | Howell et al. | |
| 8,047,874 B2 * | 11/2011 | Ito | H01R 12/716 439/607.1 |
| 8,118,604 B2 * | 2/2012 | Ma | 439/70 |
| 8,932,080 B2 * | 1/2015 | Chang | H05K 7/1069 439/607.1 |
| 9,004,943 B2 * | 4/2015 | Johnescu | H01R 13/65807 439/607.05 |
| 9,059,545 B2 * | 6/2015 | Mason | H01R 12/714 |
| 2014/0162472 A1 * | 6/2014 | Walden et al. | 439/66 |

* cited by examiner

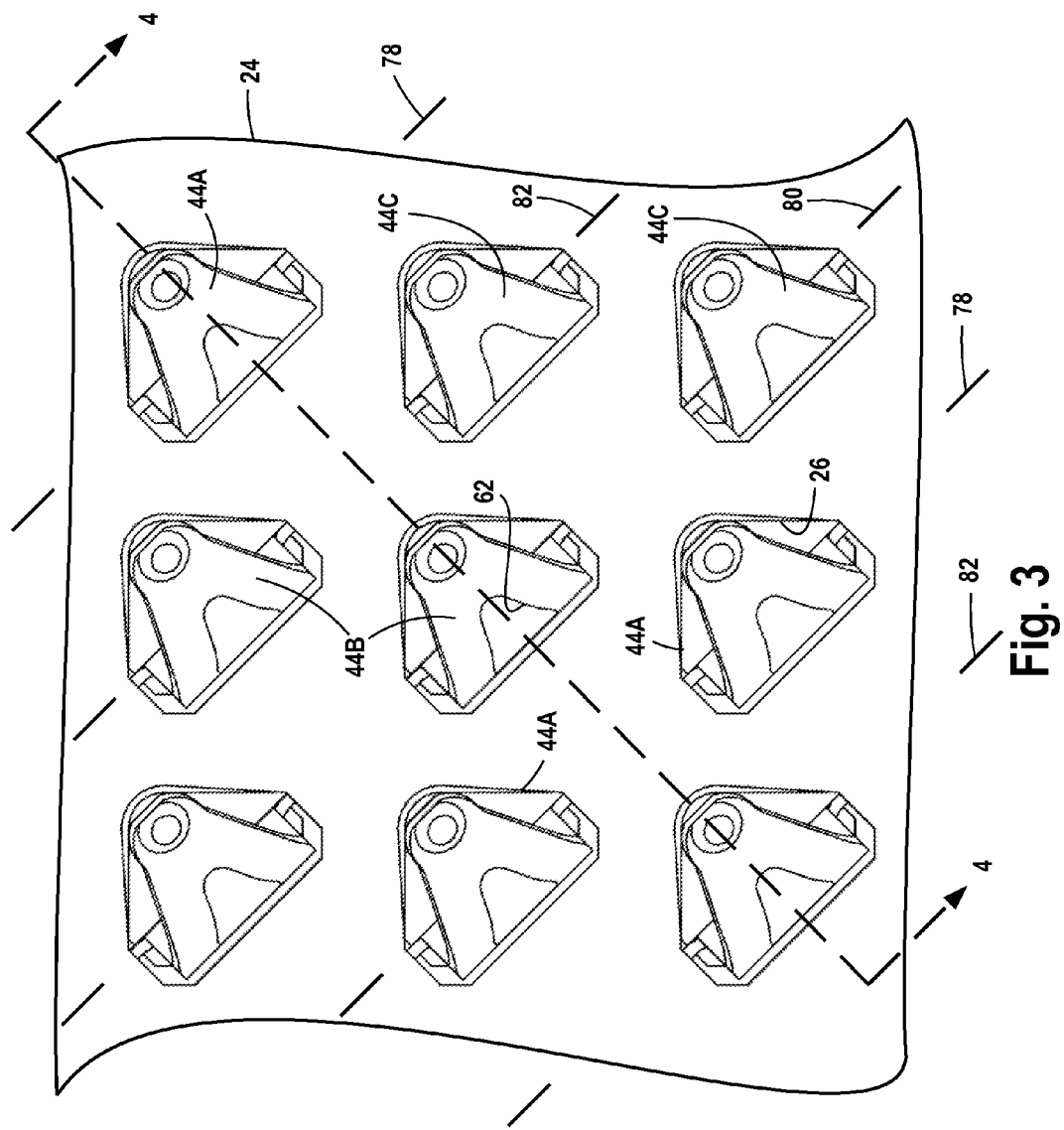

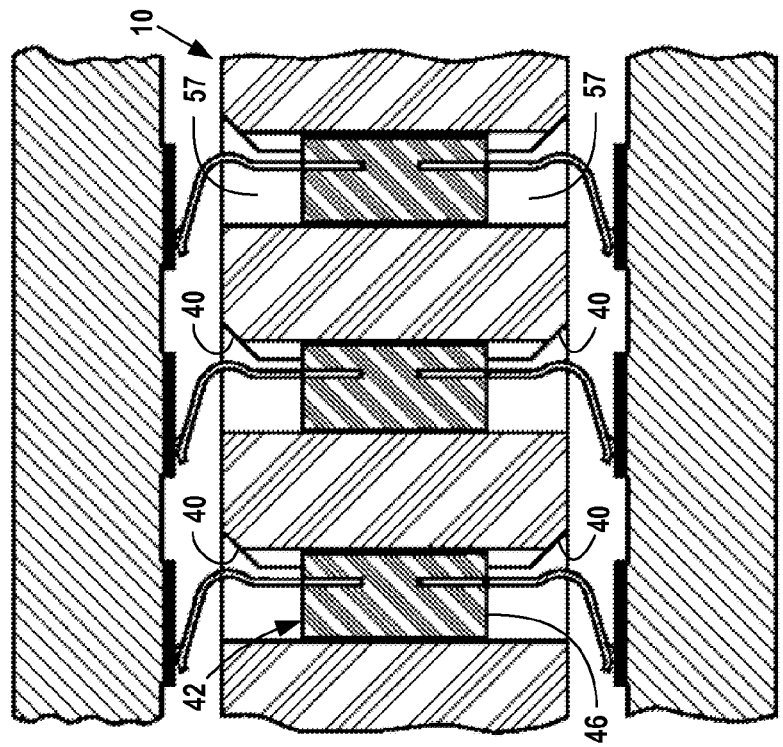
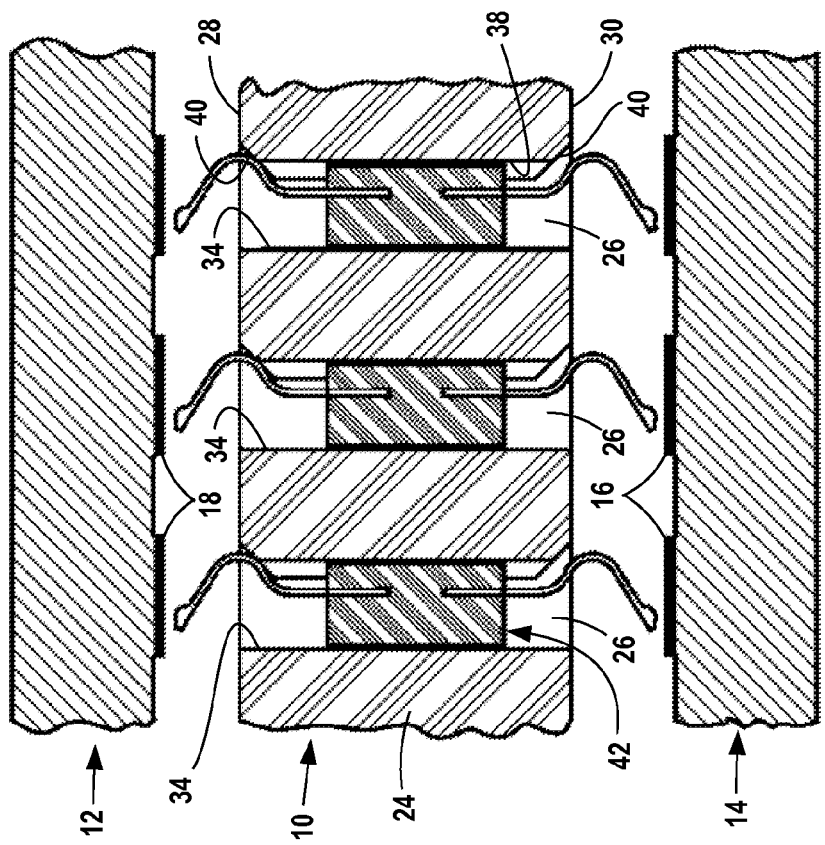
Fig. 5
Fig. 4

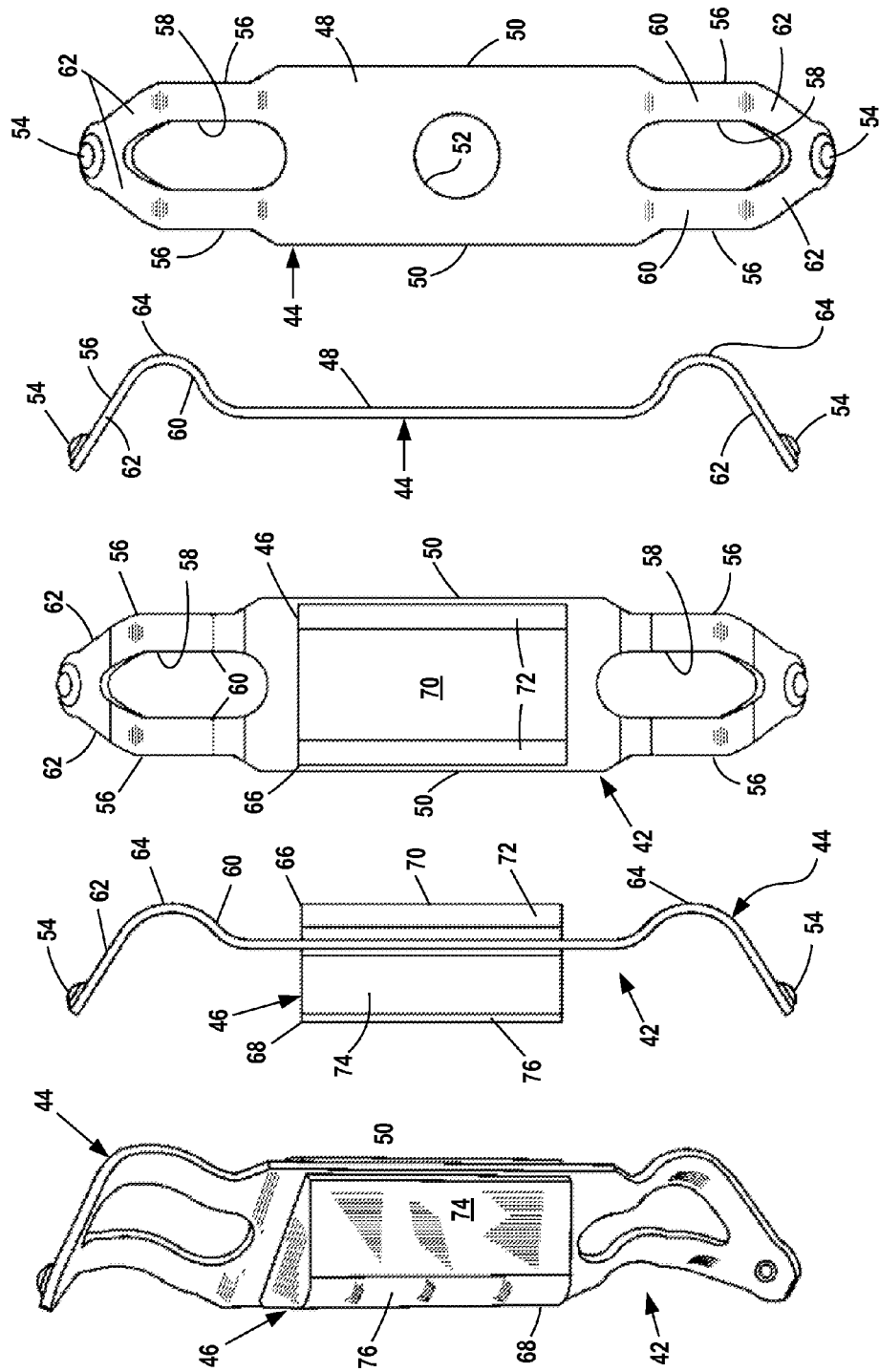

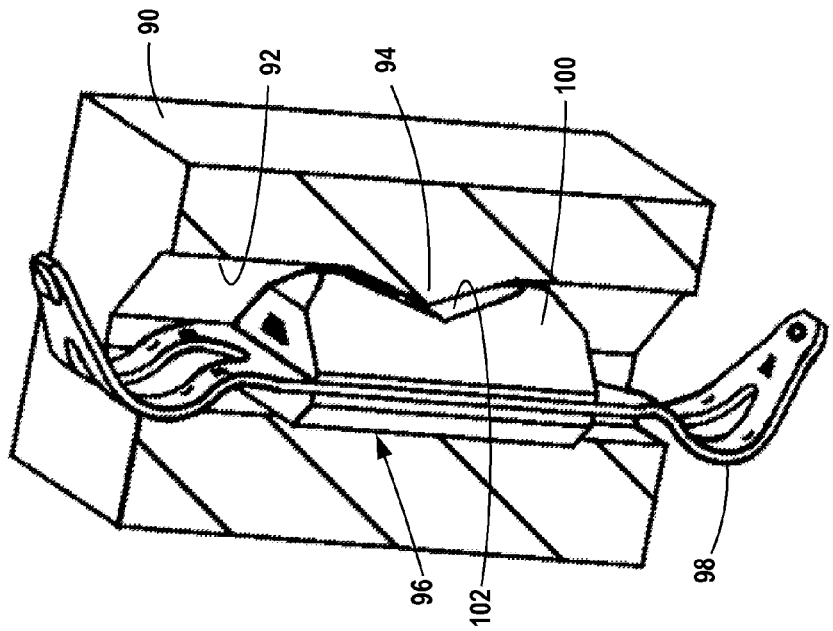
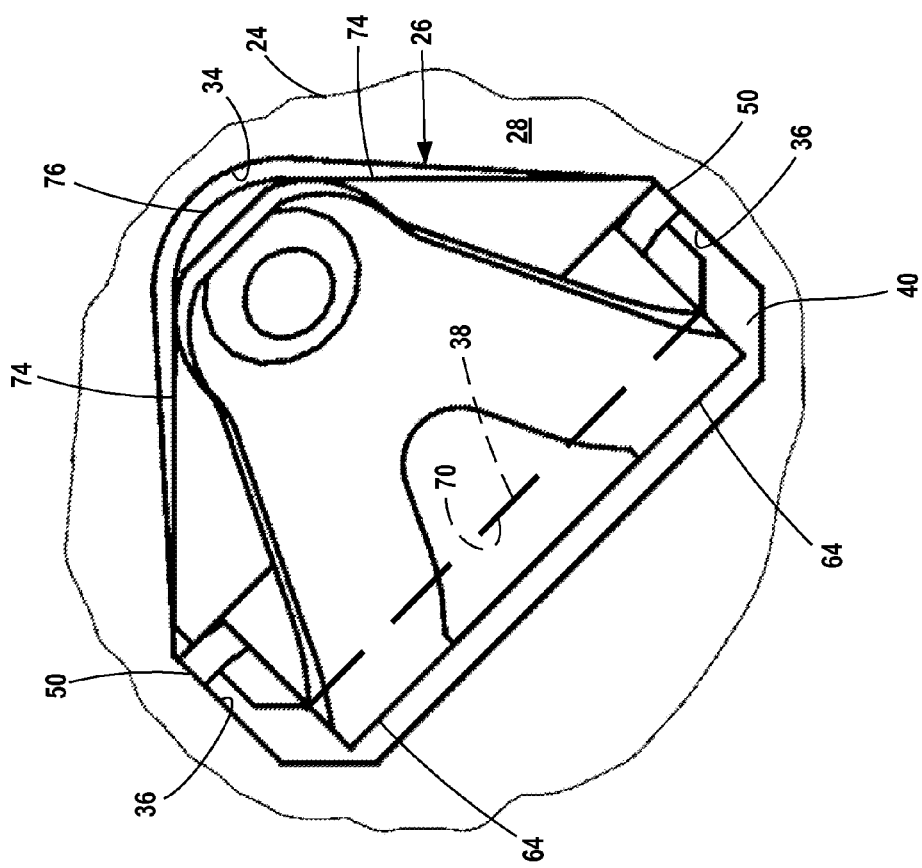
Fig. 11
Fig. 12

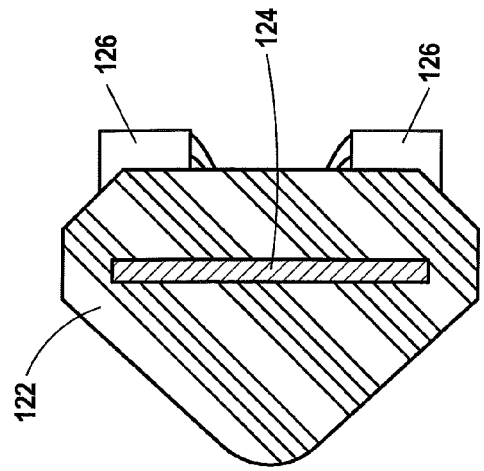
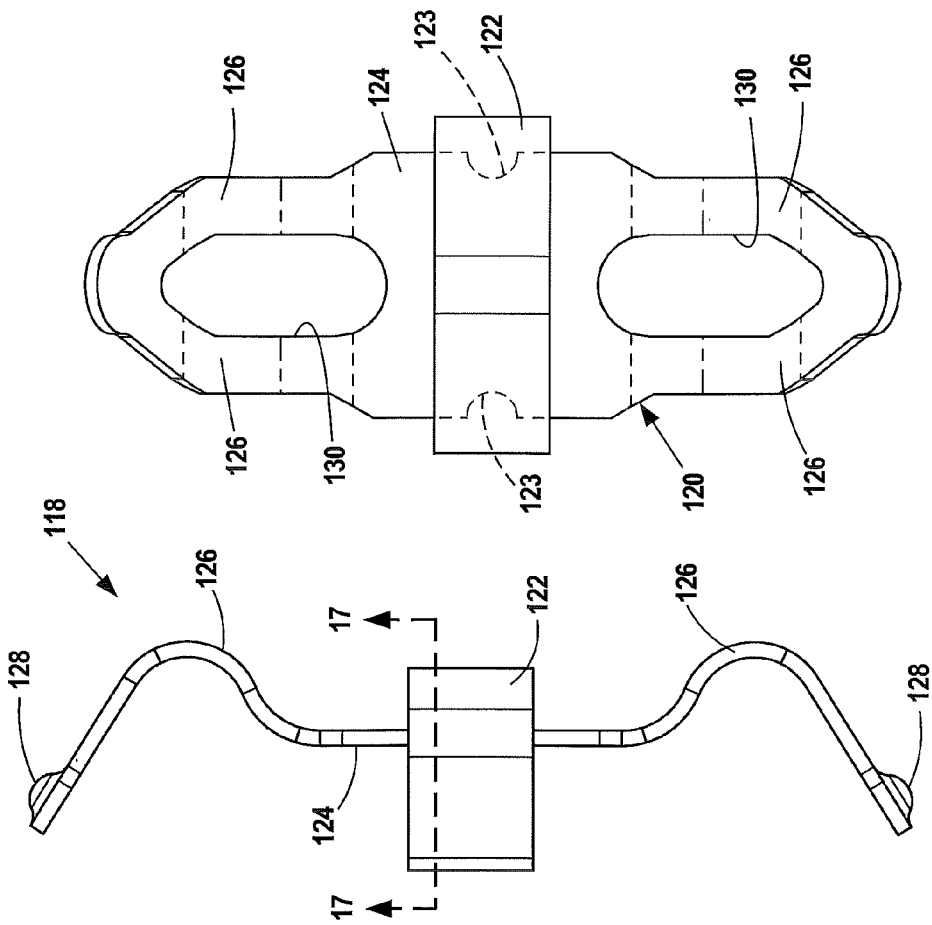

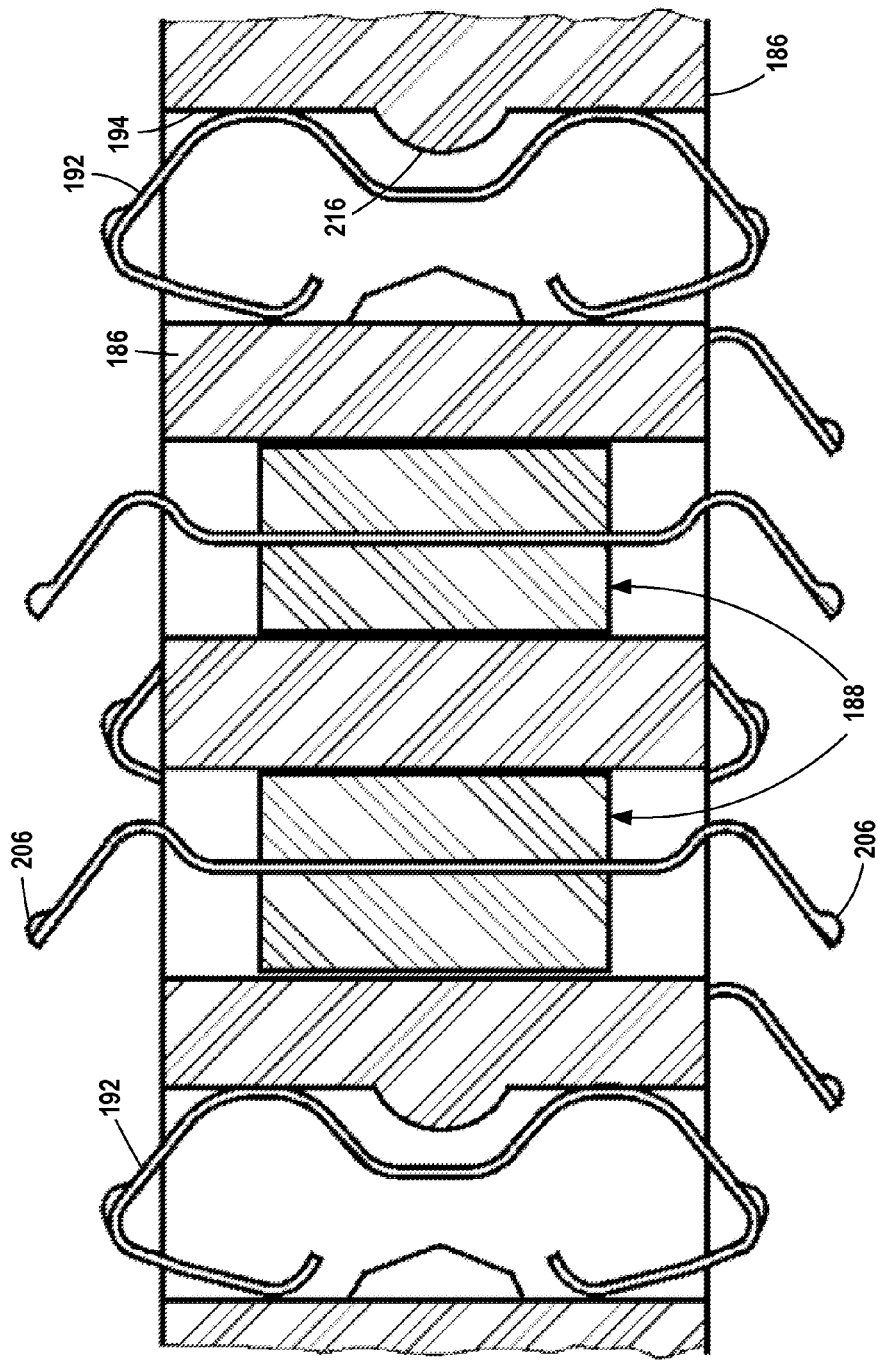

US 9,172,161 B2

IMPEDANCE CONTROLLED LGA INTERPOSER ASSEMBLY

BACKGROUND OF THE DISCLOSURE

Interposer assemblies with molded plastic plates and inserted metal contacts in the plates are used for forming electrical connections between contact pads on opposed substrates. The contacts are spaced very close together in land grid array rows and columns to establish a large number of differential pair signal connections and ground connections extending through the plate.

Increased circuit speed requires transmission of differential signals through interposer plates at signal frequencies of 10 or more gigahertz. Transmission of high-frequency signals through conventional interposer plates with short, closely spaced contacts and very fast rise times for the signals increases signal impedance and degrades signal strength. Further, high-frequency signaling can cause cross-talk between adjacent pairs of signal contacts.

SUMMARY OF THE DISCLOSURE

Improved interposer plates include through signal contacts with central impedance coupling sections located in the thickness of the plate. The coupling sections may be surrounded by plastic, which may be overmolding to reduce impedance between pairs of adjacent signal contacts.

Coupling sections of signal contacts and overmolded plastic may be fitted in openings in the plate. The plastic may surround a single through contact coupling section or a number of through contact coupling sections.

Interposer assemblies with signal contacts having overmolded coupling sections reduce impedance during high-frequency signal transmission. Ground contacts may be provided to reduce cross-talk between adjacent pairs of signal contacts.

The signal contacts may have a pair of individual contact arms extending from one end or each end of the coupling section to single contact points, with an opening between each pair of arms. The two contact arms reduce impedance and establish reliable electrical connections with pads on overlying and underlying substrates. The contact arms may extend into the plate.

DESCRIPTION OF THE DRAWINGS

FIG. 3 is a top view of a portion of an interposer assembly showing an insulating plate and a number of contact members;

FIG. 4 is a sectional view taken generally along line 4-4 of FIG. 3 taken through the interposer assembly and the upper and lower substrates before establishment of electrical connections;

FIG. 5 is a sectional view like FIG. 4 after the establishment of electrical connections between pads on the substrates;

FIG. 6 is a perspective view of a contact member;

FIGS. 7 and 8 are side and back views of the contact member;

FIGS. 9 and 10 are side and back views of a metal contact used in the member;

FIG. 11 is an enlarged top view of a contact member in the plate;

FIG. 12 is a sectional view through another embodiment interposer assembly plate and contact member;

FIGS. 15 and 16 are side and front perspective views of a contact member used in the assembly of FIG. 13;

FIG. 17 is an enlarged sectional view taken along line 17-17 of FIG. 15;

FIG. 25 is a sectional view taken along line 25-25 of FIG. 24;

DETAILED DESCRIPTION OF THE PREFERRED EMBODIMENTS

Figure 2:
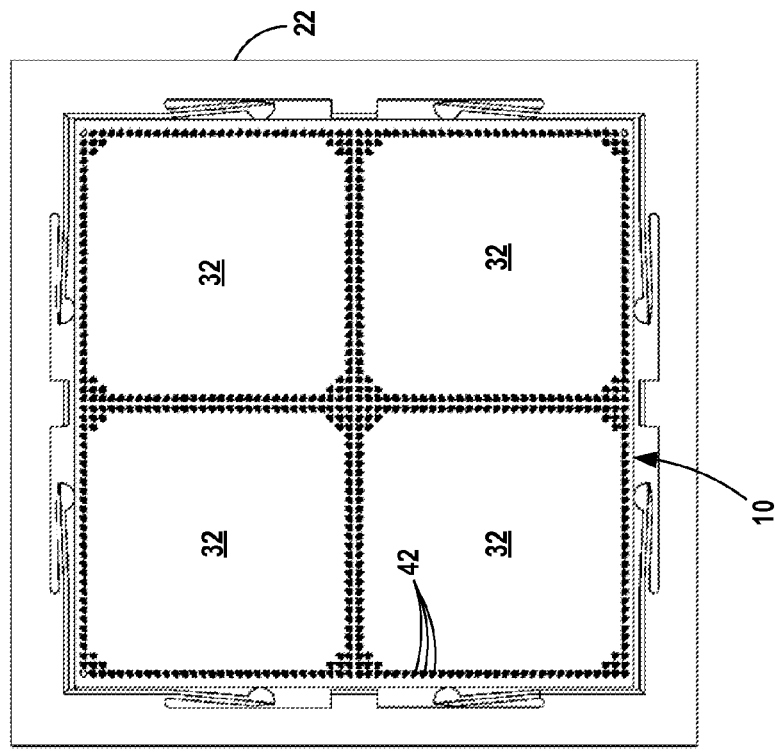
FIG. 2 is a top view illustrating the interposer assembly in an alignment frame.
Figure 1:
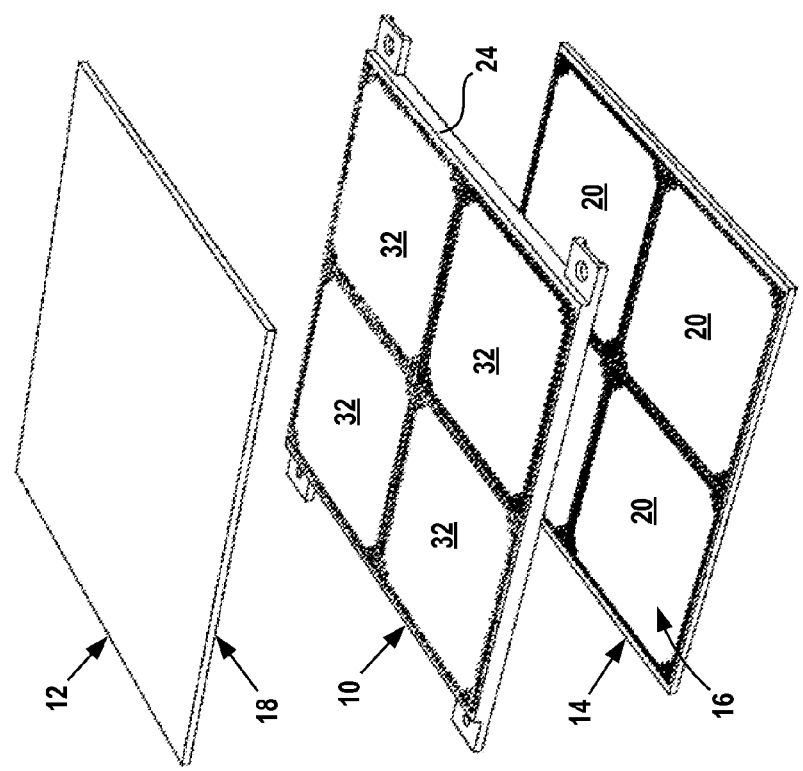
FIG. 1 is an exploded view of an interposer assembly and upper and lower substrates.

FIG. 1 illustrates interposer assembly 10 located between upper substrate 12 and lower substrate 14. Assembly 10 forms a large number of electrical connections between contact pads 16 on the upper surface of substrate 14 and contact pads 18 on the lower surface of substrate 12. The pads 16 and 18 are formed in closely spaced land grid array rows and columns. The pads on both substrates are arranged in quadrants 20, shown in FIG. 1.

Interposer assembly 10 is mounted in dielectric frame 22 and includes an injection-molded dielectric plate 24 with a large number of closely spaced through passages or apertures 26 extending between the plate top surface 28 and bottom surface 30. The passages 26 are arranged in four quadrants 32, corresponding to quadrants 20 and are positioned in closely spaced LGA rows and columns corresponding to the rows and columns of contacts 16 and 18 on substrates 12 and 14. Each quadrant in plate 10 may include over 1,200 passages 26. Plate 10 may have a thickness of about 2 to 3 mm.

The plate is injection-molded from a suitable dielectric resin, which may be a glass-filled liquid crystal polymer. Liquid crystal polymer resins are used in interposer assembly plates 24 because the resin can be injection-molded to form large parts with a large number of accurately molded and closely spaced through passages.

Through passages 26 are illustrated in FIGS. 4, 5 and 11. Each passage includes a U-shaped wall 34 extending between passage sides 36 and across the thickness of plate 24 between plate slides 28 and 30. Each passage 26 includes a flat wall 38 extending between the sides 36, across from wall 34. Angled stop surfaces 40 extend inwardly from top and bottom surfaces 28 and 30 to wall 38.

A contact member 42 is positioned in each passage 26. Member 42 includes a metal contact 44 stamp-formed from uniform thickness and appropriately plated metal stock and an overmolded plastic body 46. Contact 44 may be formed from gold-plated beryllium copper strip stock having a thickness of about 0.043 mm.

Metal contact 44 is illustrated in FIGS. 9 and 10 and includes a wide central coupling section 48 with parallel side edges 50. The coupling section may be a flat plate, as illustrated. Circular opening 52 extends through the center of section 48. A central contact point 54 is provided at each end of contact 44 and is connected to the ends of section 48 by a pair of spaced, reverse bend cantilever spring arms 56. Elongate opening 58 extends through the thickness of member 42 between each pair of arms 56. Each arm 56 includes an inner portion 60, extending from coupling section 48 laterally to an outer portion 62 which angles inwardly across the coupling section to contact point 54. Reverse bends 64 are located on one side of coupling section 48, and points 54 are on the opposite side of the coupling section. See FIG. 9.

Plastic body 46 is overmolded on or otherwise attached to coupling section 48 of contact member 42 and includes side portion 66 on the side of coupling section 48 between reverse bends 64 and side portion 68 on the opposite side of the coupling section between points 54. The body 46 may be molded from the same resin used in forming plate 24. The body may be molded from other resins, if desired. The body may be unitary and extend through opening 52 to secure portions 66 and 68 on member 42. The body may have two parts which engage each other and hold the parts on the contact. The body 46 may surround the coupling section to eliminate air gaps.

Side portion 66 includes a flat surface 70 parallel to and spaced outwardly from coupling section 48 and beveled side walls 72. Body portion 68 includes inwardly angled and flat side walls 74 joined by rounded corner 76. As illustrated in FIGS. 6 and 11, the side edges 50 of coupling section 48 extend out from body 46 to maximize the area of the section and improve impedance reduction.

The contact members 42 are positioned adjacent to passages 26 and are moved into the passages. During insertion, the lead reverse bends of the metal contact members engage stop surfaces 40, are elastically deflected inwardly and then elastically return to their initial positions when the contact members are fully inserted. The contact members have sliding fits in the through passages without air gaps. Gravity holds the members in down positions shown in FIG. 4 with the reverse bends 64 on the tops of the members engaging stop surfaces 40.

Plate 24 with inserted contact members 42 is positioned between upper and lower substrates 12 and 14 as shown in FIG. 4 with pads 16 and 18 aligned for engagement by contact points 54. The substrates are moved together so that contacts 16 and 18 engage contact points 54, and spring arms 56 are elastically flexed toward plate 24 as contact points 54 wipe along the pads to form reliable high-pressure electrical connections with the pads, as shown in FIG. 5. During compression of the spring arms, contact members 42 are lifted up a short distance in passages 26. The contact members are free of the plate to assure equal contact pressure is provided at the opposed contact pads 16 and 18.

Bodies 46 have a vertical height less than the thickness of the plate. Each pair of spring arms 56 extend from a point 54 located above or below the plate into a recess 57 in the top or bottom of a passage 26 and then into a body 46. Each spring arm includes a portion located in a recess 57. When the interposer assembly is sandwiched between the substrates, the two spring arms at each side of the plate, including the portions located in recesses 57, are flexed as illustrated in FIG. 5. The pairs of flexed arms provide desired resilient contact pressure forming reliable electrical connections with the pads on the substrates. The separate spring arms 56 are more resilient than a solid wide tab at the end of contact 44.

Interposer assembly 10 is used to transmit high-speed differential signals between the contact pads on upper and lower substrates 12 and 14. The signal frequency may be 10 gigahertz or higher. Pairs of adjacent signal contacts 44 in the substrate carry positive and negative differential signal components between the substrates. The overmolded coupling sections of adjacent signal contacts reduce impedance. Ground contacts connect ground pads on the substrates.

In one application, illustrated in FIG. 3, the metal contacts 44A in contact members in rows 78 form ground connections between opposed ground pads on the substrates. Pairs of adjacent contacts 44B and 44C on rows 80 and 82, between rows 78, form differential signal connections between corresponding pads on the substrates. Differential signals are transmitted through interposer assembly 10 using many pairs of adjacent contact members 44B and 44C positioned on adjacent rows 80 and 82.

Coupling sections 48 in the contact members reduce impedance between pairs of signal-carrying contact members. Arms 56 extend above and below the coupling sections and form extensions of sections 48 to further reduce impedance. Coupling sections 48 extend laterally across the full width of passages 26 to maximize coupling area. See FIG. 11. Signals transmitted through the substrate by contacts 44 extend from one contact point 54 through both adjacent spring arms 56, through coupling section 48, through the second pair of spring arms 56 and to the opposite contact point 54.

FIG. 12 illustrates a portion of another embodiment interposer assembly having a plate 90 with through passages 92 extending between the top and bottom plate surfaces. Plate 90 is related to plate 24 and includes a large of number of passages 92 arranged in closely spaced land grid array rows and columns. Each passage 92 has a cross-section similar to the cross-section of passage 26 but with an inwardly extending retention projection 94 formed in one side of the passage equidistant between the top and bottom surfaces of the plate. Contact member 96 is positioned in passage 92. The contact member 96 includes a stamp-formed metal contact 98, which may be identical to contact 44, and an overmolded plastic body 100.

The metal contact 98 includes a wide central coupling section, like coupling section 48, and spring arms and contact points at each end of the coupling section, like arms 56 and points 54. The spaced spring arms extend the coupling section above and below the top and bottom surfaces of plate 90.

Members 96 are inserted into passages 92. Bodies 100 and projections 94 are elastically deformed during insertion and return to their initial positions when the contact members are fully inserted, as illustrated in FIG. 12. Projections 94 extend loosely into recesses 102 in bodies 100 to provide limited free vertical movement of the members 96 in the plate, like limited free movement of members 42 in plate 24. Plate 90 is sandwiched between upper and lower substrates to form electrical connections between aligned pads on the substrates in the same manner as plate 10, illustrated in FIGS. 4 and 5. The loose engagement between projections 94 and recesses 102 assures equal contact pressure at opposed contact points.

The contact members in plate 90 form electrical connections between pads on overlying underlying substrates like contact members in plate 24 and reduce impedance between adjacent signal contact pairs, as previously described.

FIGS. 13-17 disclose a portion of another embodiment interposer assembly 110. Interposer assembly 110 includes a thin plate 112, which may have a thickness of about 2 mm. The plate is molded of the same plastic resin as plate 24. Through passages 114 extend between the top and bottom surfaces of plate 112 and are arranged in LGA rows and columns. The passages are like passages 26 and include opposed stop surfaces 116. Stop surfaces 116 are like surfaces 40, shown in FIGS. 4 and 5.

Contact members 118 are fitted in passages 114. The contact members 118 include metal contacts 120, which are like contacts 44 but have a central coupling section which is shorter than coupling section 48. The reduction in length of the coupling section in contacts 118 corresponds to the reduction in thickness of plate 112 from the thickness of plate 24. The metal contacts also include contact points, spring arms and central openings like those described in connection with contact 44. The geometries of the arms and points at the ends of contacts 120 are the same as those in contacts 44 in order to establish electrical connections with the pads on the overlying and underlying substrates.

Overmolding 122 surrounds shortened central coupling section 124. The overmolding has a sliding fit in passage 114. The molding extends completely around the coupling section and into recesses 123 in the sides of coupling section 124. See FIG. 16. The coupling section does not have a through opening, like opening 52. Arms 126 at the ends of the coupling section extend from the coupling section to contact points 128. Openings 130 extend between the arms.

Figures 13, 14:
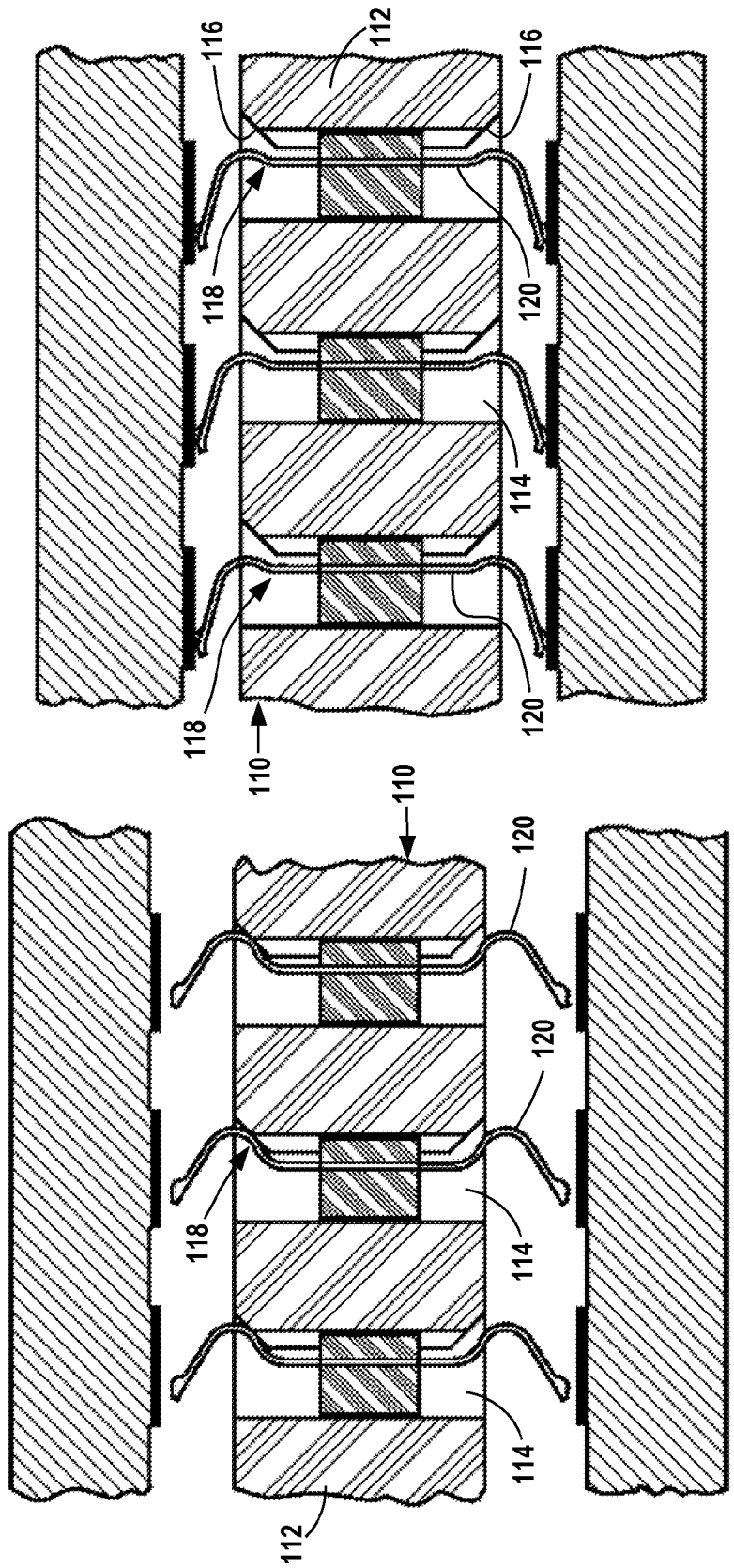
FIGS. 13 and 14 are sectional views of another embodiment interposer assembly.

Interposer assembly 110 is sandwiched between pads on overlying and underlying substrates as shown in FIG. 14. Coupling sections 124 and arms 126 reduce impedance between adjacent signal contacts 120. The overmolding 122 also reduces signal contact impedance.

Figure 18:
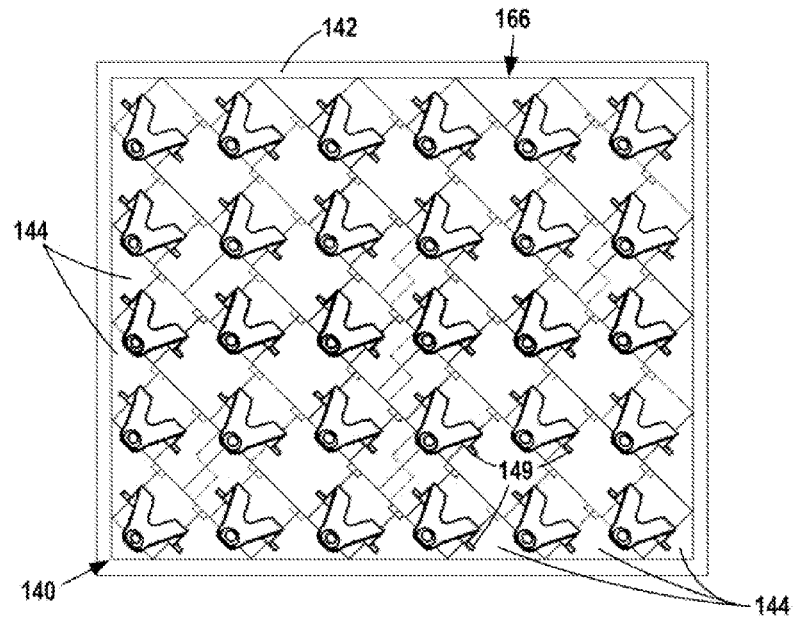
FIG. 18 is a top view of another embodiment interposer assembly.
Figure 19:
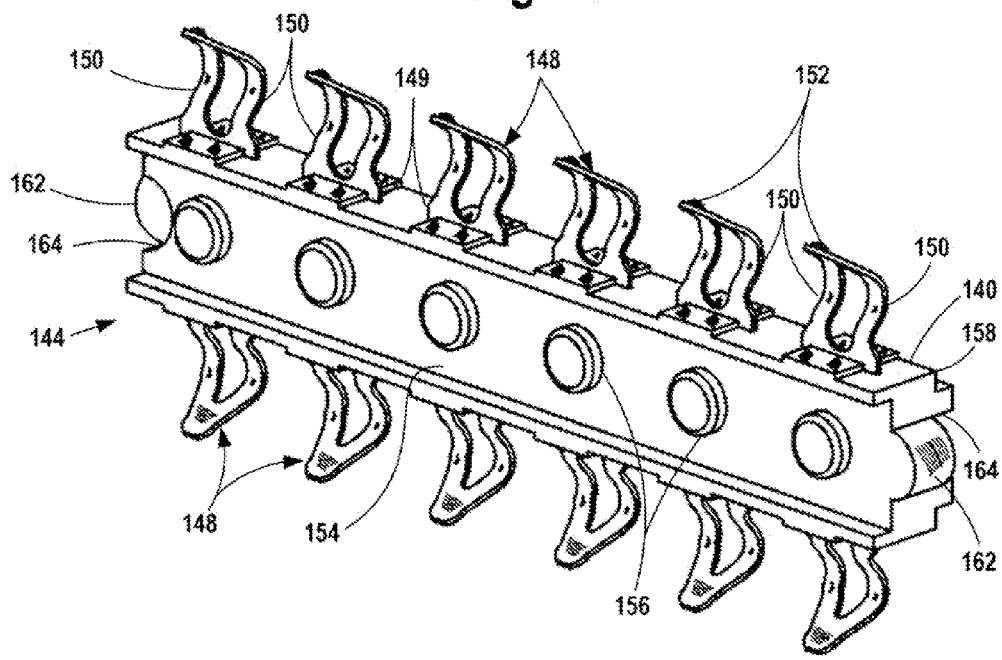
FIGS. 19 and 20 illustrate a contact member used in the assembly of FIG. 18.
Figure 20:
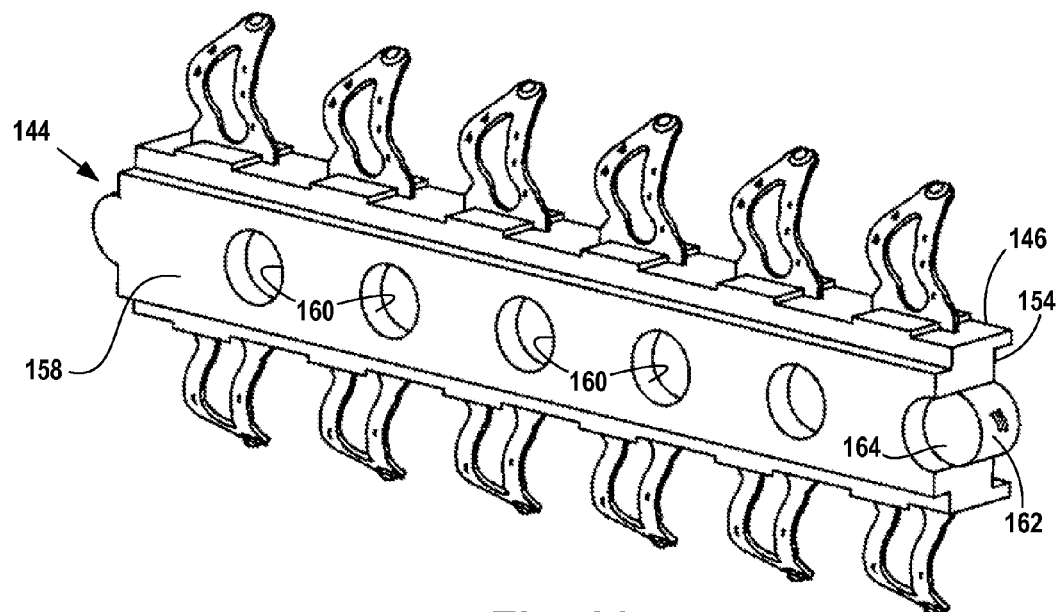

FIG. 18 is a top view of another embodiment interposer assembly 140 in frame 142. Assembly 140 includes a number of different length contact members 144 joined together and fitted in the frame. FIGS. 19 and 20 illustrate one contact member 144. Each contact member 144 includes an elongate molded plastic body 146 which surrounds the central coupling sections 149 of a series of metal contacts 148, like contacts 44. The contacts 148 may or may not have central openings, like openings in contacts 44. The contacts 148 have spaced, inwardly angled spring arms 150 and contact points 152, like arms 56 and points 54.

Plastic body 146 is molded from the same resin forming previously described plates and has a generally rectangular transverse cross-section with a channel 154 extending along one side of the body and lock projections 156 spaced along channel 154. Flat rib 158 extends outwardly from the opposite side of plastic body 146 and has a close fit in channel 154 in an adjacent body 146. Circular recesses 160 are spaced along and extend into rib 158. Lock projection 162 and recess 164 are provided on each end of body 146. As illustrated, the recesses on each end of the body are located on opposite sides of the body.

Figure 21:
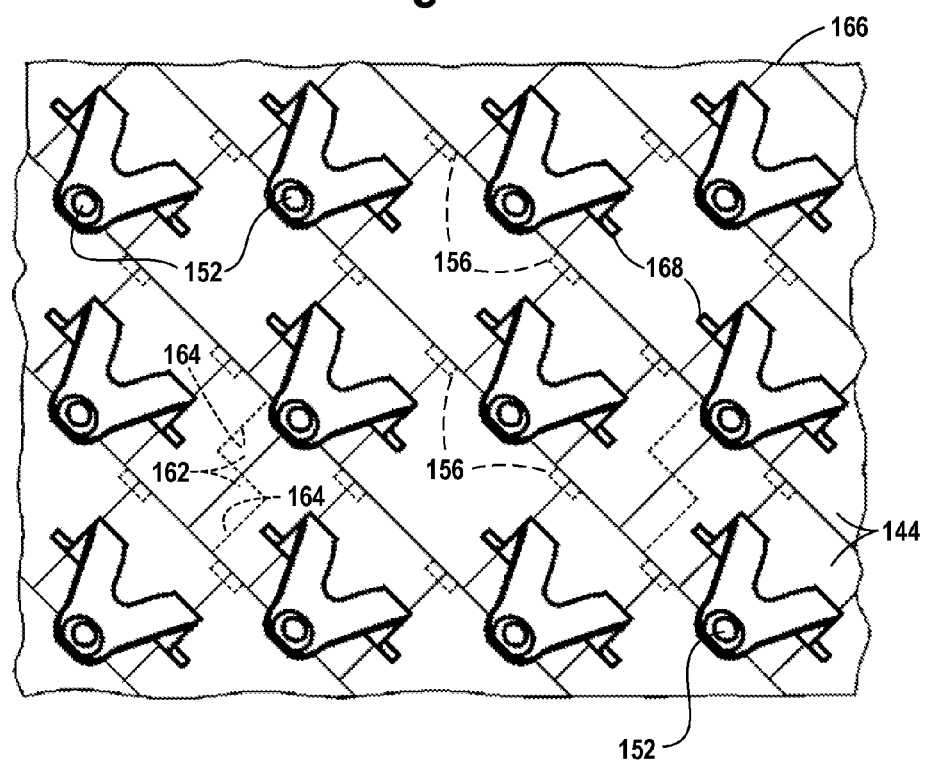
FIG. 21 is an enlarged view of a portion of the assembly of FIG. 18.

Interposer assembly 140 includes a plate 166 made up from a number of different length, interlocked contact members 144 extending at 45° diagonally across the plate. Contact members 144 are locked together end-to-end with ribs 158 fitted in channels 154 and projections 156 locked in recesses 160. Projections and recesses 162 and 164 on the ends of abutting members engage each other to retain the members in proper position. See FIG. 21.

The contact points 152 on members 144 in assembly 140 are arranged together in land grid array rows and columns like the contact points of the previously described interposer assemblies.

Electrical connections are established between pads on top and bottom substrates by sandwiching plate 166 between the substrates and elastically bending spring arms 150 toward the plate to form resilient, wiped high-pressure connections between the contact points and the pads, as previously described.

The metal contacts 148 each include wide, rectangular central coupling sections 168 imbedded in bodies 146 and extending a short distance above and below the bodies. The coupling sections and the two spring arms 150 above and below each coupling section effectively reduce impedance between adjacent signal contacts, as previously described. The resin surrounding the coupling sections reduces impedance.

Figure 22:
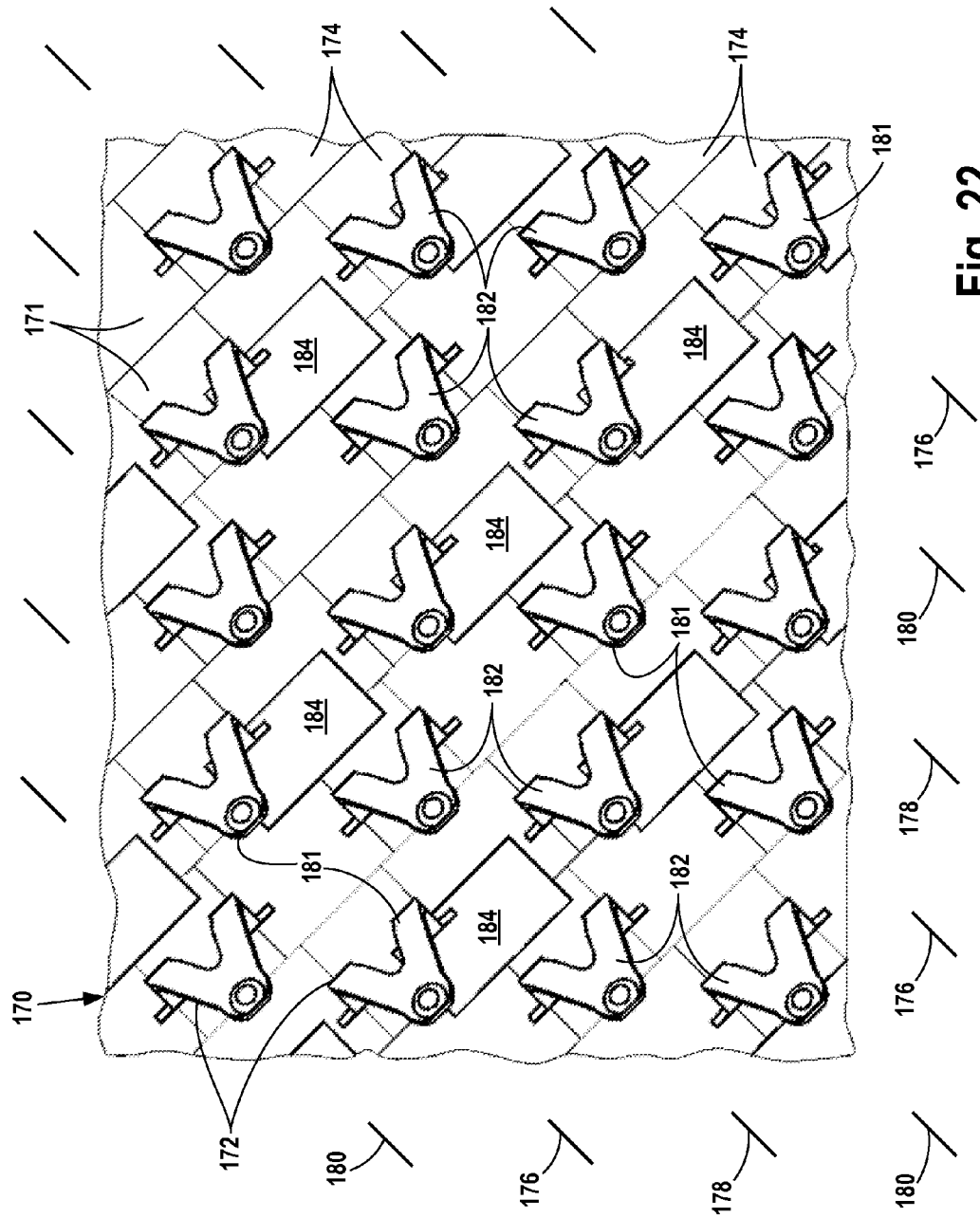
FIGS. 22 and 23 are top views of portions of two other interposer assembly embodiments.
Figure 24:
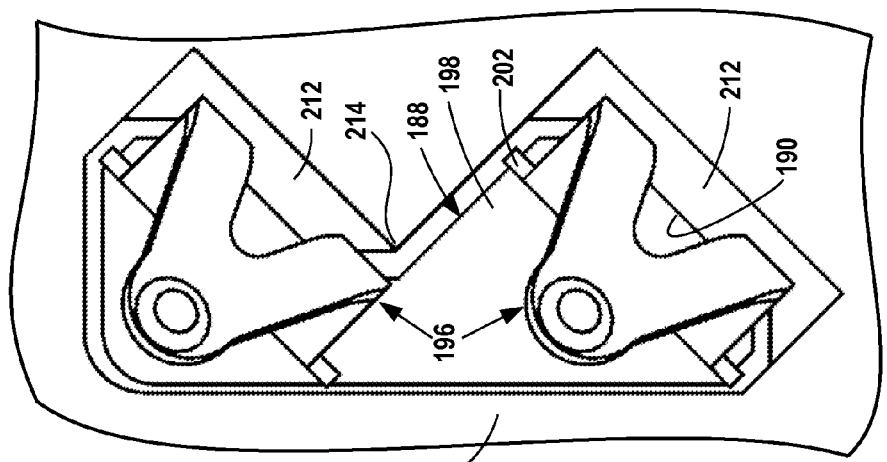
FIG. 24 illustrates a contact member used in the assembly of FIG. 23.

FIG. 22 is a top view of a portion of another embodiment interposer assembly plate 170 related to plate 166. Plate 170 is mounted in a frame like frame 142 and includes a number of elongate contact members 171 similar to members 144. Metal contacts 172 are molded in plastic strip bodies 174. The bodies 174 are joined together to form plate 170, as previously described. The members 171 are arranged in diagonal rows extending across plate 170. Ground contacts 181 are spaced along ground contact rows 176. Signal contacts 182 are spaced along signal contact rows 178 and 180. High-speed differential signals are transmitted through plate 170 using adjacent pairs of vertically spaced signal contacts 182 with one contact in row 180 and the other contact in row 178.

Recesses or openings 184 extend through the thickness of the plate 170 at the lower edge of alternate plastic strip bodies 174. The openings 184 also extend a short distance into the adjacent, lower strip bodies. Openings 184 are located between adjacent vertical signal contact pairs 182, reduce dielectric resin between the contact pairs, and reduce signal cross-talk between the adjacent signal contact pairs.

The central coupling sections and contact arms in adjacent signal contact pairs 182 and the dielectric resin between the contact pairs reduce differential signal impedance.

Figure 23:
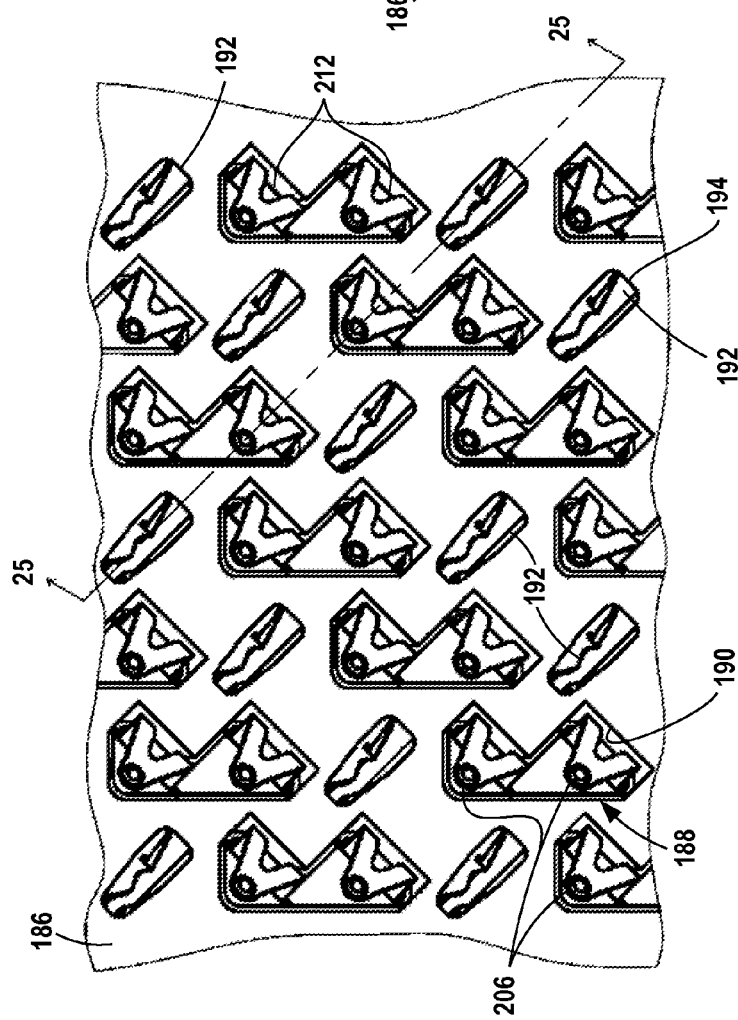

FIG. 23 is a top view of a portion of an interposer assembly plate 186 mounted in a frame, as previously described. Plate 186 is molded from the same resin as the previously described plates. Two contact members 188, illustrated in FIGS. 24-27, are fitted in each through passage 190 formed in plate 186. Ground contacts 192 are positioned in through passages 194 in plate 186.

Figure 27:
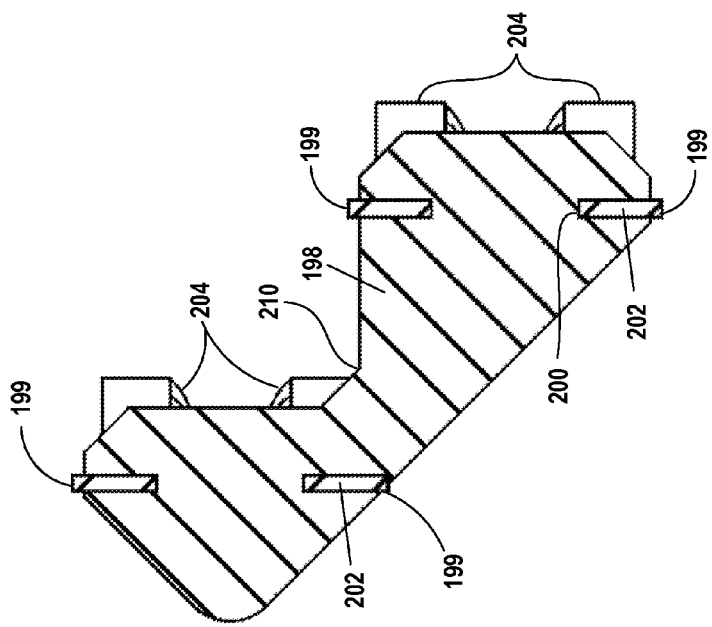
FIG. 27 is a sectional view taken along line 27-27 of FIG. 26.
Figure 26:
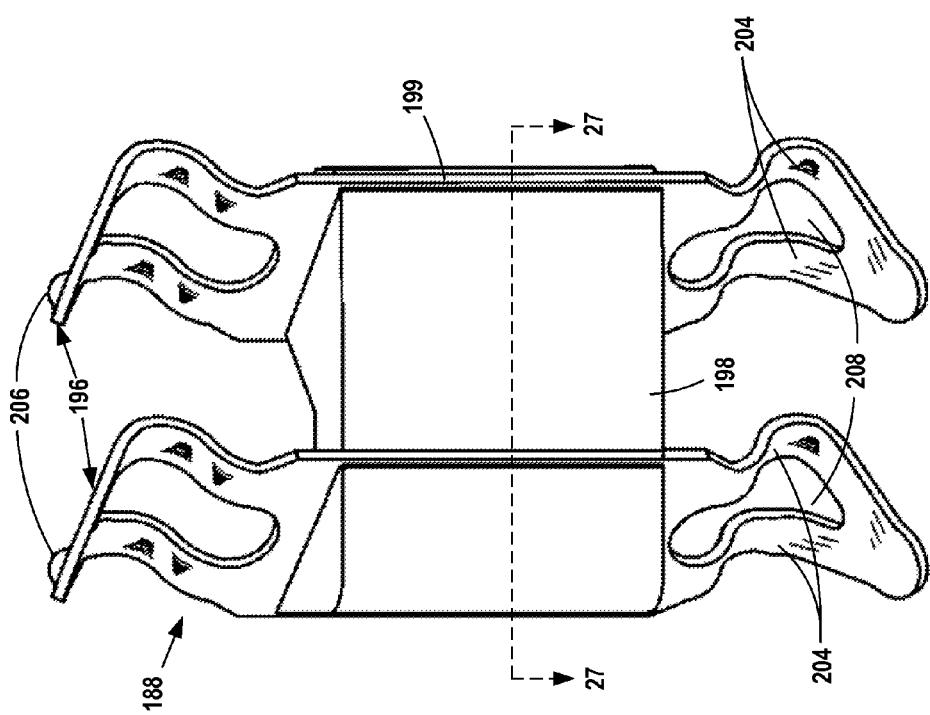
FIG. 26 is a perspective view of a contact member used in the assembly of FIG. 23.

Each contact member 188 includes two parallel and diagonally offset metal contacts 196, which may be identical to contacts 44, and overmolded plastic body 198. The contact side edges 199 extend outwardly from the plastic body, as in contact 42, as illustrated in FIG. 27. The metal contacts have central openings 200 extending through wide rectangular central coupling sections 202. Pairs of inwardly angled spring arms 204 extend above and below coupling section 202 to connect contact points 206 to the sections 202. Openings 208 extend through the metal contacts between the arms. The arms are provided with reverse bends, as previously described. Plastic body 198 extends diagonally to the planes of the sections in contacts 196 and includes an alignment recess 210 between the metal contacts 196.

Each passage 190 generally conforms to the shape of body 198 and includes two angled stop surfaces 212 on the top and bottom sides for engagement with the reverse bends in arms 204, as previously described. Projection 214, between contacts 196, extends into recess 110 to facilitate positioning of member 188 in the passage. Members 188 are inserted into passages 190 in the same manner members 42 are inserted into passages 26.

Ground contacts 192 may be of the type disclosed in U.S. Pat. No. 6,174,707 and are retained in passages 194 by retention projections 216.

As illustrated in FIG. 23, the contact points 206 on contacts 196 and the contact points of ground contacts 192 are arranged in horizontal and vertical land grid array rows and columns.

The contact members 188 have loose fits in through passages 190 and are retained in the passages by the reverse bend portions of arms 204, as previously described.

The interposer assembly shown in FIG. 23, including plate 186, contact members 188 and ground contacts 192, is sandwiched between upper and lower substrates to form land grid array connections between pads on the substrates, as previously described. The pairs of contacts 196 in each member 188 transmit high-speed differential signals through the assembly. Impedance is reduced because of the large-area coupling sections imbedded in the resin without air spaces and by dual conducting arms extending above and below the coupling section, as previously described. Additionally, the ground contacts 192 in air space passages 194 between adjacent members 188 reduce cross-talk between signal contact pairs.

Figure 28:
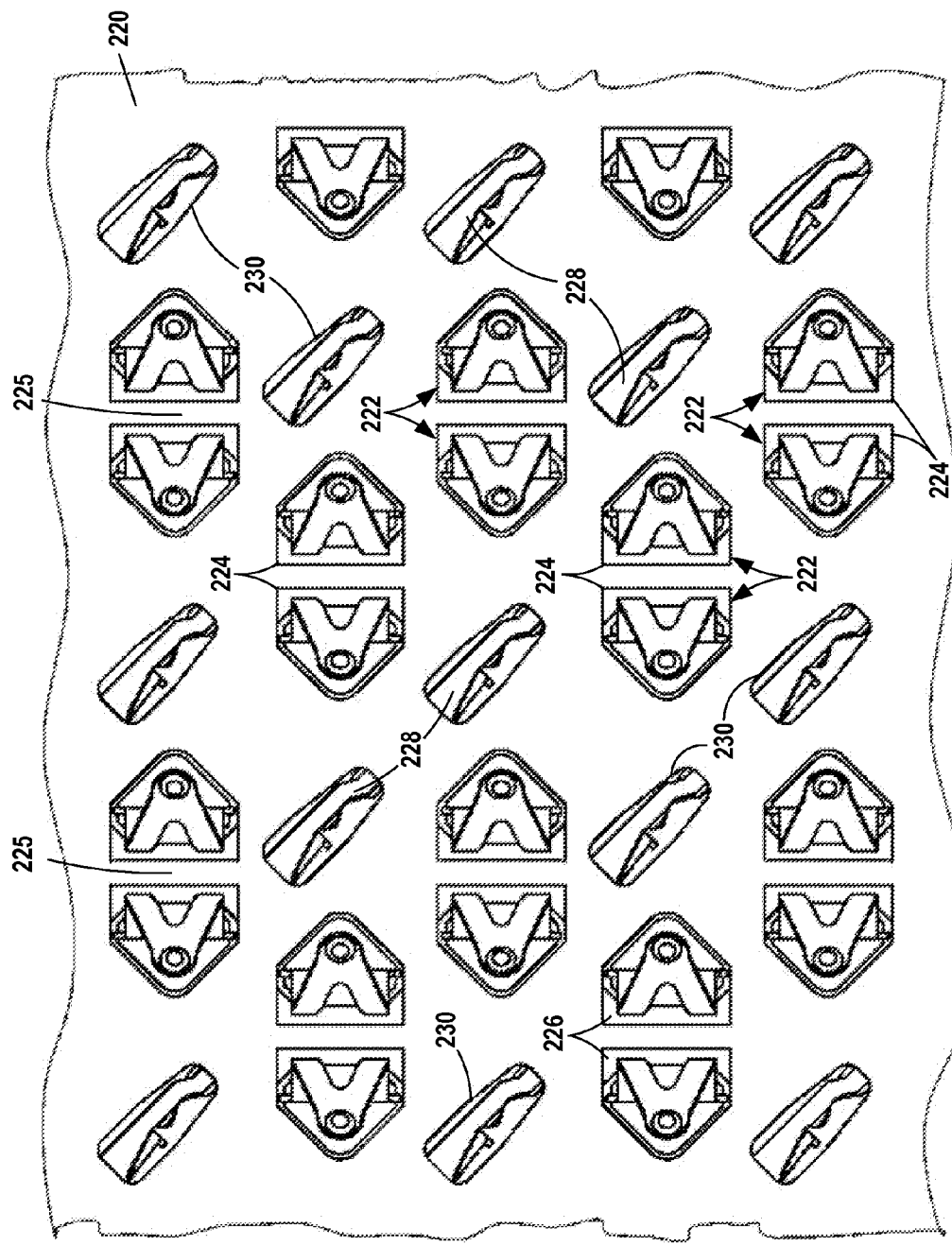
FIG. 28 is a top view of a portion of another embodiment interposer assembly.
Figures 29, 30:
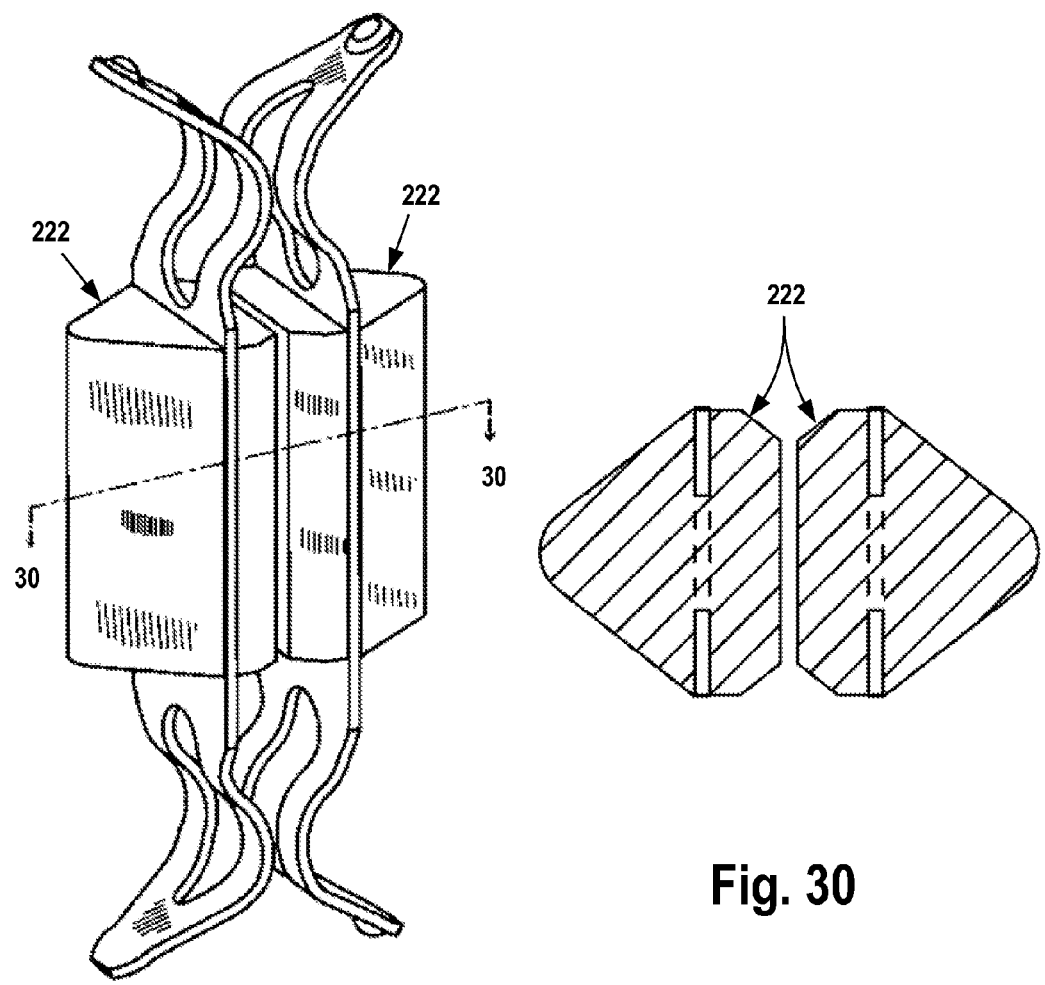
FIG. 29 is a perspective view of two contact members used in the interposer assembly of FIG. 28.
FIG. 30 is a sectional view taken along line 30-30 of FIG. 29.

FIG. 28 illustrates another embodiment interposer plate 220 similar to previously described plates. Plate 220 is molded from the same resin as previously described plates. Pairs of back-to-back contact members 222 are positioned in back-to-back pairs of through passages 224 in plate 220. Passages 224 are like previously described passages 26 and include angled stop surfaces 226 at the top and bottom surfaces of plate 220. The flat walls 221 of adjacent passages are separated by thin walls 225. The contact members 222 are inserted into passages 224. Reverse bends on the spring arms of the members engage stop surfaces to loosely confine the members in the passages, as previously described.

Ground contacts 228, like contacts 192, are held in passages 230, like passages 194. The contact points on contact members 220 and on ground contacts 228 are arranged in vertical and horizontal LGA rows and columns, as previously described. Back-to-back pairs of signal contact members 222 are arranged in offset diagonal rows extending from the lower right to the upper left, as shown in FIG. 28. Ground contact members are also arranged in offset diagonal rows extending from the lower right to the upper left, as shown in FIG. 28. Each ground contact 228 is located between two adjacent vertical and two adjacent horizontal pairs of signal contact members to reduce cross-talk between the members. In each back-to-back pair of signal contact members, the central coupling sections and the contact arms extending upwardly and downwardly from the coupling sections are closely adjacent to each other with the sections imbedded in overmolded resin to reduce impedance.

The disclosed metal contacts have coupling sections with overmolded resin surrounding the sections. The overmolded plastic eliminates air space between the sections and the plastic to reduce impedance between adjacent signal contacts.

If desired, the plastic may be attached to the coupling sections after molding. For instance, pre-molded plastic may be adhered to the coupling sections, or pre-molded plastic may include two interlocking portions which mount the plastic on the coupling section. The plastic may be mounted on one side of a coupling section only.

The disclosed metal contacts include flat, rectangular coupling sections for reducing impedance between adjacent pairs of signal contacts. Flat coupling sections have maximum area and efficiently reduce impedance between adjacent signal contacts. A coupling section need not be flat to reduce impedance but may be curved or bent.

In the disclosed interposer assemblies, the closely spaced contact points on both sides of the plate are arranged in LGA rows and columns with the distance between adjacent contact points in each row and column being about 1.0 mm. Different spacings may be used, if desired.

The contact members in the disclosed interposer assemblies are located on the interposer assembly plate in closely spaced, perpendicular land grid array rows and columns, as illustrated. The large-area plates forming coupling sections or shields are parallel to each other and extend at an acute angle to the rows and columns. This angle may be 45°, as illustrated in FIG. 18.

What we claim as our invention:

1. An interposer plate assembly for forming electrical connections between contacts on opposed substrates, the assembly comprising an insulating plate having a top surface, a bottom surface and a thickness between the top surface and the bottom surface; and a plurality of one-piece metal contacts, each contact comprising a central portion in the insulating plate, a first contact point spaced from one surface of the insulating plate to engage a pad, two first cantilever arms extending from the central portion to the contact point, and a first opening through the contact between the arms; the insulating plate including a number of through passages; plastic bodies on the contact central portions, said bodies in said passages; and said bodies movable in said passages.

2. The assembly as in claim 1 wherein the central portion of each contact comprises an impedance coupling metal plate.

3. The assembly as in claim 2 wherein the metal plates are flat.

4. The assembly as in claim 2 wherein each contact point is offset to one side of a metal plate.

5. The assembly as in claim 2 wherein the contacts are formed from uniform-thickness metal stock.

6. The assembly as in claim 2 wherein each contact includes a second contact point spaced from the other surface of the insulating plate to engage a pad, two second cantilever arms extending from the central portion to the second contact point and a second opening through the contact between such arms.

7. The assembly as in claim 1 wherein such plastic bodies are overmolded on the central portions.

8. The assembly as in claim 1 wherein each passage includes an angled surface, the metal contact or the plastic body in the passage extending over said surface.

9. The assembly as in claim 1 wherein the central portions are generally rectangular with side edges at or adjacent the sides of the plastic bodies.

10. The assembly as in claim 1 wherein each cantilever arm includes a flexible portion located inside the insulating plate.

11. The assembly as in claim 10 wherein each flexible portion includes a reverse bend on one side of the central portion, the contact point on the opposite side of the central portion.

12. An interposer plate assembly for forming electrical connections between contacts on opposed substrates, the assembly comprising an insulating plate having a top surface, a bottom surface, a thickness between the top surface and the bottom surface, and a plurality of through passages extending between the top and bottom surfaces; and a plurality of contact members, each contact member comprising a metal contact with opposed contact points and a central large area impedance coupling section between the contact points, and an insulating plastic body on the impedance coupling section; said contact members located in and substantially filling said passages with the contact points spaced outwardly from the top and bottom surfaces of the plate, the insulating bodies in the insulating plate and the coupling sections extending between opposed passage walls, wherein the impedance coupling sections reduce impedance in high-frequency signals carried by pairs of adjacent contact members; said contact members each having a sliding fit in a through passage, said insulating plate and contact members including inter-engaging surfaces for limiting movement of the contact members in the passages.

13. The assembly as in claim 12 wherein each impedance coupling section comprises a uniform-thickness metal plate, and each insulating body comprises a plastic overmolding on the metal plate.

14. The assembly as in claim 13 wherein each metal plate is flat.

15. The assembly as in claim 12 wherein said passages are arranged in perpendicular rows and columns and each impedance coupling section extends at an acute angle to said rows and columns.

16. The assembly as in claim 15 wherein said angle is about 45° to both the rows and the columns.

17. The assembly as in claim 12 wherein each contact member includes two arms extending between the impedance coupling section and each contact point, and an opening between the arms.

18. An interposer plate assembly for forming electrical connections between contacts on opposed substrates, the assembly comprising an insulating plate having a top surface, a bottom surface, a thickness between the top surface and the bottom surface, and a plurality of through passages extending between the top and bottom surfaces; and a plurality of contact members, each contact member comprising a metal contact with opposed first contact points, a central large area impedance coupling section between the contact points, each contact comprising two arms extending between the impedance coupling section and each contact point, and an opening between the arms, each arm comprising a reverse bend with a first portion of the arm on one side of an impedance coupling section and a second portion of the arm on the opposite side of the impedance coupling section, and the contact point is on the opposite side of the impedance coupling section; and an insulating body on the impedance coupling section; said contact members in said passages with the contact points spaced outwardly from the top and bottom surfaces of the insulating plate, the insulating bodies in the insulating plate and the coupling sections extending between opposed passage walls, wherein the impedance coupling sections reduce impedance in high-frequency signals carried by pairs of adjacent contact members.

19. The assembly as in 18 wherein each impedance coupling section comprises a flat metal plate extending across or substantially across a through passage.

20. The assembly as in claim 19 wherein each insulating body includes side edges and a corner on one side of the impedance coupling section and a flat portion on the opposite side of the impedance coupling section.

21. The assembly as in claim 18 wherein one contact member includes an additional contact point.

22. The assembly as in claim 18 wherein the impedance coupling sections are laterally offset, and are coplanar or parallel to each other.

23. The assembly as in claim 18 wherein each plastic body has a height less than the thickness of the insulating plate.

24. The assembly as in claim 18 wherein part of each contact arm is located in a through passage.

25. An interposer plate assembly for forming electrical connections between contacts on opposed substrates, the assembly comprising an insulating plate having a top surface, a bottom surface, a thickness between the top surface and the bottom surface, and a plurality of through passages extending between the top and bottom surfaces; and a plurality of contact members, each contact member comprising a metal contact with opposed contact points, a central large area impedance coupling section between the contact points, each contact member including two spring arms joined to each contact point, both said spring arms located in a through passage, and an insulating plastic body on the impedance coupling section, each plastic body having a height less than the thickness of the insulating plate; said contact members in said passages with the contact points spaced outwardly from the top and bottom surfaces of the insulating plate, the insulating bodies in the insulating plate and the coupling sections extending between opposed passage walls, wherein the impedance coupling sections reduce impedance in high-frequency signals carried by pairs of adjacent contact members.

26. The assembly as in claim 25 wherein each spring arm includes a reverse bend located in a passage below a plate top or bottom surface.

27. An interposer plate assembly for forming electrical connections between contacts on opposed substrates, the assembly comprising an insulating plate having a top surface, a bottom surface, a thickness between the top surface and the bottom surface and a number of through passages; a plurality of one-piece metal contacts, each contact comprising a central impedance coupling portion in the plate, first and second contact points spaced from the plate top and bottom surfaces to engage pads on the substrates and a cantilever arm extending from the central portion to each contact point; and a plastic body on each central portion, said plastic bodies and contacts movable in said passages.

28. The assembly as in claim 27 wherein each arm comprises a reverse bend located to one side of its respective coupling portion, and the contact point is on the other side of such coupling portion.

29. The assembly as in claim 28 wherein each metal contact includes contact edges, a reverse bend portion between the central portion and the contact tip, an elongate central opening and a pair of arms to either side of the opening, each arm including a curved inner portion at the reverse bend and a straight outer portion joining the contact point, the contact point located centrally between said contact edges.

30. The assembly as in claim 27 wherein said plastic bodies have sliding fits in said through passages, said plate and said plastic bodies including inter-engaging surfaces for limiting movement of the contact members in the passages.

* * * * *